(12) United States Patent
Yang

(10) Patent No.: US 9,990,969 B2
(45) Date of Patent: Jun. 5, 2018

(54) PAGE BUFFER AND MEMORY DEVICE INCLUDING THE SAME

(71) Applicant: SK hynix Inc., Gyeonggi-do (KR)

(72) Inventor: In Gon Yang, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days. days.

(21) Appl. No.: 15/350,512

(22) Filed: Nov. 14, 2016

(65) Prior Publication Data

US 2017/0358335 A1    Dec. 14, 2017

(30) Foreign Application Priority Data

Jun. 9, 2016    (KR) .......................... 10-2016-0071872

(51) Int. Cl.
　　*G11C 7/10*　　(2006.01)
　　*G11C 8/18*　　(2006.01)
　　*G06F 12/06*　　(2006.01)

(52) U.S. Cl.
　　CPC ........ *G11C 7/1084* (2013.01); *G06F 12/0638* (2013.01); *G11C 7/1087* (2013.01); *G11C 8/18* (2013.01); *G06F 2212/205* (2013.01)

(58) Field of Classification Search
　　CPC ....... G11C 8/18; G11C 7/1087; G11C 7/1084; G06F 2212/205; G06F 12/0638
　　See application file for complete search history.

(56) References Cited

U.S. PATENT DOCUMENTS

| | | | | |
|---|---|---|---|---|
| 7,196,928 B2* | 3/2007 | Chen | ................... | G11C 11/5642 365/185.09 |
| 7,254,064 B2* | 8/2007 | Kim | .................... | G11C 11/5628 365/185.18 |
| 7,359,248 B2* | 4/2008 | Chen | ................... | G11C 11/5628 365/185.22 |
| 7,719,902 B2* | 5/2010 | Dong | .................. | G11C 11/5628 365/185.11 |
| 8,902,659 B2* | 12/2014 | Chan | ........................ | G11C 7/12 365/185.17 |
| 9,570,180 B2* | 2/2017 | Maejima | ................ | G11C 16/10 |

FOREIGN PATENT DOCUMENTS

| | | |
|---|---|---|
| KR | 1020110024181 | 3/2011 |
| KR | 1020170069010 | 6/2017 |

* cited by examiner

*Primary Examiner* — Vanthu Nguyen

(74) *Attorney, Agent, or Firm* — IP & T Group LLP

(57) ABSTRACT

Provided herein are a page buffer and a memory device having the same. The page buffer may include: a latch circuit comprising a first node configured to be set to a first level in response to a sense amplifier strobe signal when an operation of setting up a bit line is performed during a program operation of a semiconductor memory device; a current control circuit configured to supply an internal power to a current sensing node depending on a value of the first level of the first node; and a page buffer sensing circuit configured to couple the bit line to the current sensing node in response to a page buffer sensing signal and control a potential level of the bit line depending on a potential level of the page buffer sensing signal.

15 Claims, 7 Drawing Sheets

PAGE BUFFER AND MEMORY DEVICE INCLUDING THE SAME

CROSS-REFERENCE TO RELATED APPLICATION

The present application claims priority under 35 U.S.C. § 119(a) to Korean patent application number 10-2016-0071872 filed on Jun. 9, 2016, which is herein incorporated by reference in its entirety.

BACKGROUND

1. Field

Various embodiments of the present disclosure relate to an electronic device, and more particularly, to a page buffer and a memory device including the same.

2. Description of Related Art

Semiconductor memory devices are generally classified into volatile and nonvolatile memory devices.

Unlike a volatile memory device, a nonvolatile memory device can maintain data stored therein even when power supply to the device is interrupted. However, read and write speeds of a nonvolatile memory device are comparatively lower than those of a volatile memory device. Therefore, nonvolatile memory devices may be employed in applications requiring maintaining the stored data regardless of whether or not the power supply is on or off. Examples of a nonvolatile memory device include a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), and a ferroelectric RAM (FRAM). The flash memory may be classified into NOR and a NAND flash memory.

Flash memory combines both advantages of a RAM in that data is programmable and erasable and advantages of a ROM in that data stored therein may be retained even when power is interrupted. Flash memory is widely used as a storage medium of portable electronic devices such as a digital camera, a personal digital assistant (PDA) and MP3.

Flash memory devices may be classified into a two-dimensional semiconductor device in which strings are horizontally formed on a semiconductor substrate, and a three-dimensional semiconductor device in which strings are vertically formed on the semiconductor substrate.

The three-dimensional semiconductor device was devised to overcome a limitation in the degree of integration of the two-dimensional semiconductor device and includes a plurality of strings which are vertically formed on a semiconductor substrate. Each string includes a drain select transistor, memory cells and a source select transistor which are coupled in series between a bit line and a source line.

SUMMARY

Various embodiments of the present disclosure are directed to a page buffer capable of controlling a potential level of a bit line during a program operation of a semiconductor memory device, and a semiconductor memory device including the same.

One embodiment of the present disclosure provides a page buffer including: a latch circuit comprising a first node configured to be set to a first level in response to a sense amplifier strobe signal when an operation of setting up a bit line is performed during a program operation of a semiconductor memory device; a current control circuit configured to supply an internal power to a current sensing node depending on a value of the first level of the first node; and a page buffer sensing circuit configured to couple the bit line to the current sensing node in response to a page buffer sensing signal and control a potential level of the bit line depending on a potential level of the page buffer sensing signal.

Another embodiment of the present disclosure provides a page buffer including: a main latch configured to temporarily store program data inputted from an outside during a program operation of a semiconductor memory device and control a potential level of a sensing node in accordance with the program data; a page buffer sensing circuit configured to adjust a potential level of a bit line to a program inhibit level or a first program enable voltage level depending on a page buffer sensing signal and the potential level of the sensing node during a first bit line setup operation of the program operation; a latch circuit comprising a first node configured to be set to a first level in response to a sense amplifier strobe signal during a second bit line setup operation after the first bit line setup operation has been completed; and a current control circuit configured to supply an internal power to a current sensing node depending on a value of the first level of the first node of the latch circuit, wherein the page buffer sensing circuit adjusts the potential level of the bit line to a second program enable voltage level in response to the page buffer sensing signal during the second bit line setup operation.

Another embodiment of the present disclosure provides a semiconductor memory device including: a memory cell array including a plurality of memory blocks; a voltage generating circuit suitable for generating a program voltage and a pass voltage to be supplied to word lines of the memory cell array; a page buffer circuit coupled to bit lines of the memory cell array, and suitable for performing a bit line setup operation of applying a program enable voltage or a program inhibit voltage to the bit lines depending on program data; and a control logic suitable for controlling the voltage generating circuit and the page buffer circuit to perform a program operation to the memory cell array in response to a command, wherein the page buffer circuit sequentially applies a first program enable voltage and a second program enable voltage to the bit lines using an internal power when the program enable voltage is applied to the bit lines during the bit line setup operation.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which.

DETAILED DESCRIPTION

Figure 1:
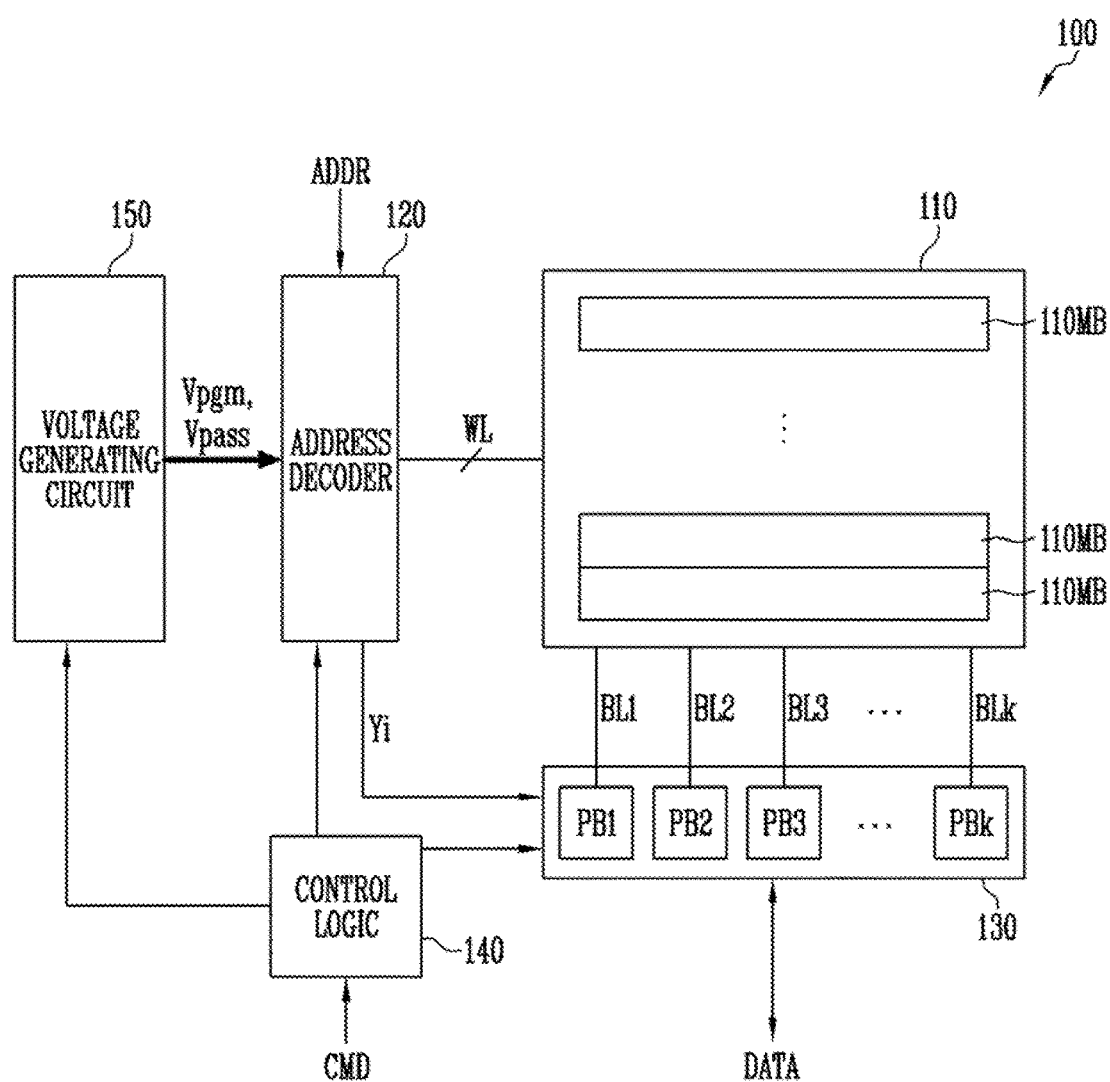
FIG. 1 is a block diagram illustrating a semiconductor memory device, according to an embodiment of the present invention.

Hereinafter, embodiments of the present invention will be described in greater detail with reference to the accompanying drawings. However, we note that the present invention may be embodied in different forms and should not be construed as being limited to the embodiments set forth herein. Rather, these embodiments are provided so that this disclosure will be thorough and complete, and will fully convey the scope of the described embodiments to those skilled in the art to which the present invention pertains.

In the drawings, dimensions may be exaggerated for clarity of illustration. It will be understood that when an element is referred to as being "between" two elements, it can be the only element between the two elements, or one or more intervening elements may also be present. Like reference numerals refer to like elements throughout.

Also, the drawings are simplified schematic illustrations of the various embodiments and their various features. As such, well-known features and details may be omitted. Also, variations from the size and shape of the various illustrated features are to be expected. For example, the size and/or shape of illustrated features may change as a result of manufacturing techniques and/or tolerances. The described embodiments should not be construed as being limited to the particular shapes and or size of features illustrated herein but may include deviations in shapes that result, for example, from manufacturing. In the drawings, lengths and sizes of layers and regions may be exaggerated for clarity. Like reference numerals in the drawings denote like elements.

Terms such as 'first' and 'second' may be used to describe various components, but they should not limit the various components. Those terms are only used for the purpose of differentiating a component from other components. For example, a first component may be referred to as a second component, and a second component may be referred to as a first component and so forth without departing from the spirit and scope of the present disclosure. Furthermore, 'and/or' may include any one of or a combination of the components mentioned.

Furthermore, a singular form may include a plural from as long as it is not specifically mentioned in a sentence. Furthermore, "include/comprise" or "including/comprising" used in the specification represents that one or more components, steps, operations, and elements exist or are added.

Furthermore, unless defined otherwise, all the terms used in this specification including technical and scientific terms have the same meanings as would be generally understood by those skilled in the related art in view of the present disclosure. The terms defined in generally used dictionaries should be construed as having the same meanings as would be construed in the context of the present disclosure and the related art, and unless clearly defined otherwise in this specification, should not be construed as having idealistic or overly formal meanings.

It is also noted that in this specification, "connected/coupled" refers to one component not only directly coupling another component but also indirectly coupling another component through an intermediate component. On the other hand, "directly connected/directly coupled" refers to one component directly coupling another component without an intermediate component.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

FIG. 1 illustrates a semiconductor memory device 100, according to an embodiment of the present invention.

Referring to FIG. 1, the semiconductor memory device 100 includes a memory cell array 110, an address decoder 120, a page buffer circuit 130, a control logic 140 and a voltage generating circuit 150.

The memory cell array 110 includes a plurality of memory blocks 110MB. The plurality of memory blocks 110MB are coupled to the address decoder 120 through a plurality of word lines WL. The plurality of memory blocks 110MB are coupled to the page buffer circuit 130 through a plurality of bit lines BL1 to BLk. Each of the memory blocks 110MB includes a plurality of memory cells. In an embodiment, the plurality of memory cells may be nonvolatile memory cells. Memory cells coupled to the same word line among the plurality of memory cells may be defined as one page. The memory cell array 110 may be configured with a plurality of pages included in each memory block 110MB.

In addition, each of memory blocks 110MB of the memory cell array 110 may include a plurality of cell strings. Each of the cell strings may include a drain select transistor, a plurality memory cells, and a source select transistor which are coupled in series between a bit line and a source line.

The address decoder 120 is coupled to the memory cell array 110 through the plurality of word lines WL. The address decoder 120 is configured to operate in response to the control of the control logic 140. The address decoder 120 receives addresses ADDR through an input/output buffer (not shown) provided in the semiconductor memory device 100.

The address decoder 120 applies a plurality of operation voltages that include a program voltage Vpgm and a pass voltage Vpass which are generated from the voltage generating circuit 150, to the plurality of memory cells and the drain and source select transistors that are included in the memory cell array 110 in accordance with the addresses ADDR.

The address decoder 120 is configured to decode a column address Yi among the received addresses ADDR during a program operation. The address decoder 120 transmits the decoded column address Yi to the page buffer circuit 130.

Addresses ADDR that are received during a program operation include a block address, a row address, and a column address Yi. The address decoder 120 selects at least one of the memory blocks 110MB in accordance with the block address and then selects at least one of the word lines WL based on the row address.

The page buffer circuit 130 includes a plurality of page buffers PB1 to PBk. The plurality of page buffers PB1 to PBk are coupled to the memory cell array 110 through the plurality of bit lines BL1 to BLk. Each of page buffers PB1 to PBk temporarily stores program data DATA inputted from an external device such as a host (not shown) during a program operation and controls a potential of a corresponding one of the bit lines BL1 to BLk in accordance with the temporarily stored program data DATA. The page buffer circuit 130 operates in response to the control of the control logic 140.

During a program operation, the plurality of page buffers PB1 to PBk in accordance with the embodiment of the present disclosure may control potential levels of the bit lines BL1 to BLk to a first program enable voltage or a second program enable voltage higher than the first program enable voltage depending on program data DATA, and may use a program-dedicated voltage or an internal power supply voltage to apply the second program enable voltage to the plurality of bit lines BL1 to BLk.

Furthermore, during a program verify operation, the page buffers PB1 to PBk sense currents of the corresponding bit lines BL1 to BLk and perform a program verify operation for the memory cells.

During a read operation, the page buffers PB1 to PBk sense currents of the corresponding bit lines BL1 to BLk and read data stored in the memory cells.

The control logic 140 is coupled to the address decoder 120, the page buffer circuit 130 and the voltage generating circuit 150. The control logic 140 receives a command CMD through the input/output buffer (not shown) of the semiconductor memory device 100. The control logic 140 is configured to control the overall operation of the semiconductor memory device 100 in response to the command CMD.

During a program operation, the control logic 140 may control the page buffers PB1 to PBk to perform a precharge operation and a discharge operation to bit lines BL1 to BLk, and to apply the first or second program enable voltage and a program inhibit voltage to the bit lines BL1 to BLk in accordance with the program data DATA stored in the page buffers PB1 to PBk.

The control logic 140 may control the potential level of the first or second program enable voltage to be applied to the bit lines BL1 to BLk by controlling potential levels of page buffer sensing signals to be applied to the page buffers PB1 to PBk when the first or second program enable voltage is applied to the bit lines BL1 to BLk.

The voltage generating circuit 150 generates and outputs a plurality of operation voltages Vpgm and Vpass under the control of the control logic 140.

Figure 2:
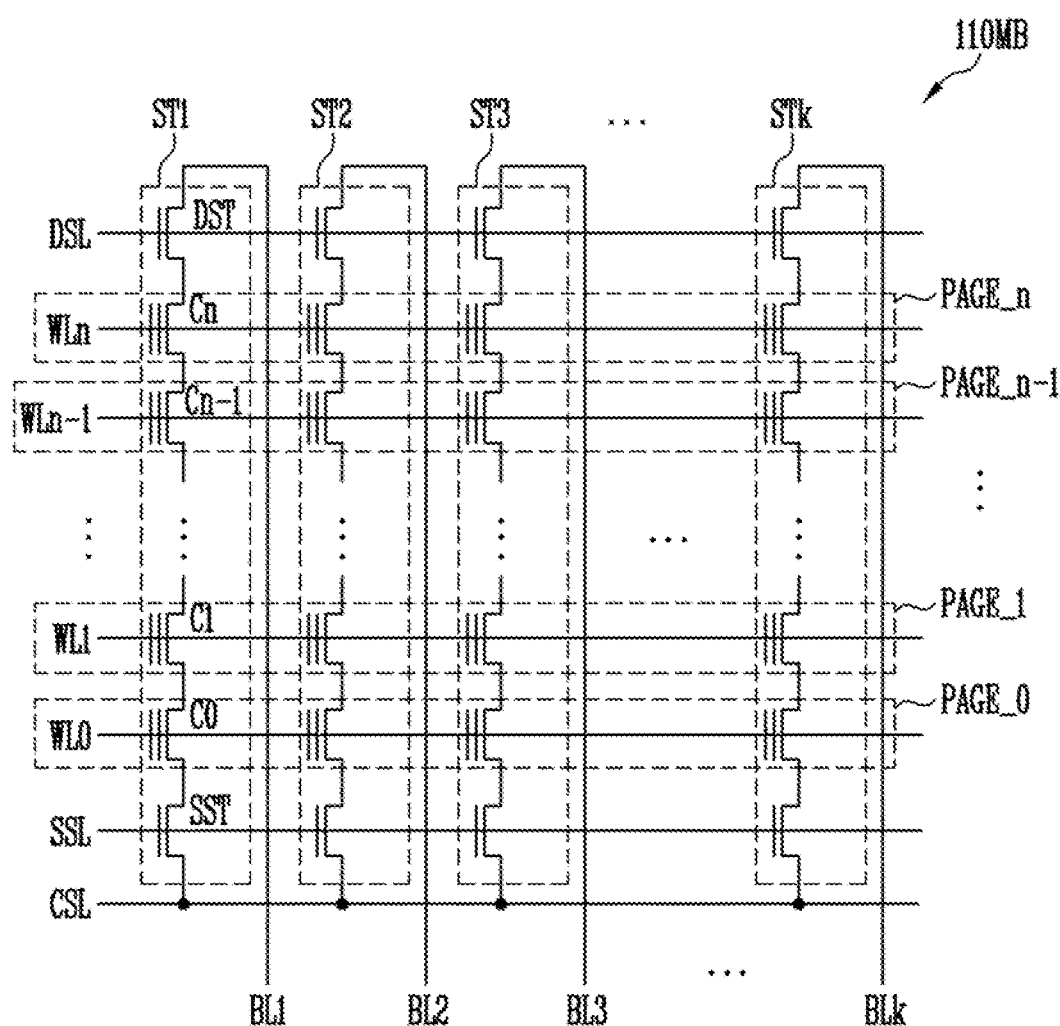
FIG. 2 is a circuit diagram illustrating a memory block of the semiconductor memory device of FIG. 1.

FIG. 2 is a circuit diagram of a memory block 110B of the semiconductor memory device 100 of FIG. 1.

The memory blocks of FIG. 1 may have the same configuration; therefore, the circuit diagram of FIG. 2 may represent any one of the memory blocks 110B of the semiconductor memory device of FIG. 1.

Referring to FIG. 2, the memory block 110MB includes a plurality of cell strings ST1 to STk, each cell string being coupled between a respective bit line BL1 to BLk and a common source line CSL. The bit lines BL1 to BLk are respectively coupled to the cell strings ST1 to STk. The common source line CSL is coupled in common to the cell strings ST1 to STk.

The cell strings ST1 to STk have the same configuration, hence only a first cell string ST1 will be described herein as an example.

Accordingly, the first cell string ST1 may include a source select transistor SST, a plurality of memory cells C0 to Cn, and a drain select transistor DST which are coupled in series in the recited order between the common source line CSL and the first bit line BL1. The gate of each of the source select transistors SST which are coupled to the different cell strings ST1 to STm is coupled to a common source select line SSL. The gates of each memory cell C0 to Cn in each of the cell strings are respectively coupled to the word lines WL0 to WLn. The gate of each drain select transistor DST is coupled to the drain select line DSL.

Each row of memory cells having their gates coupled to the same word line forms a page. For instance, the memory block 110MB of FIG. 2 includes a plurality of pages PAGE_0 to PAGE_n. Each of the pages is a basic unit during a program operation.

Figure 3:
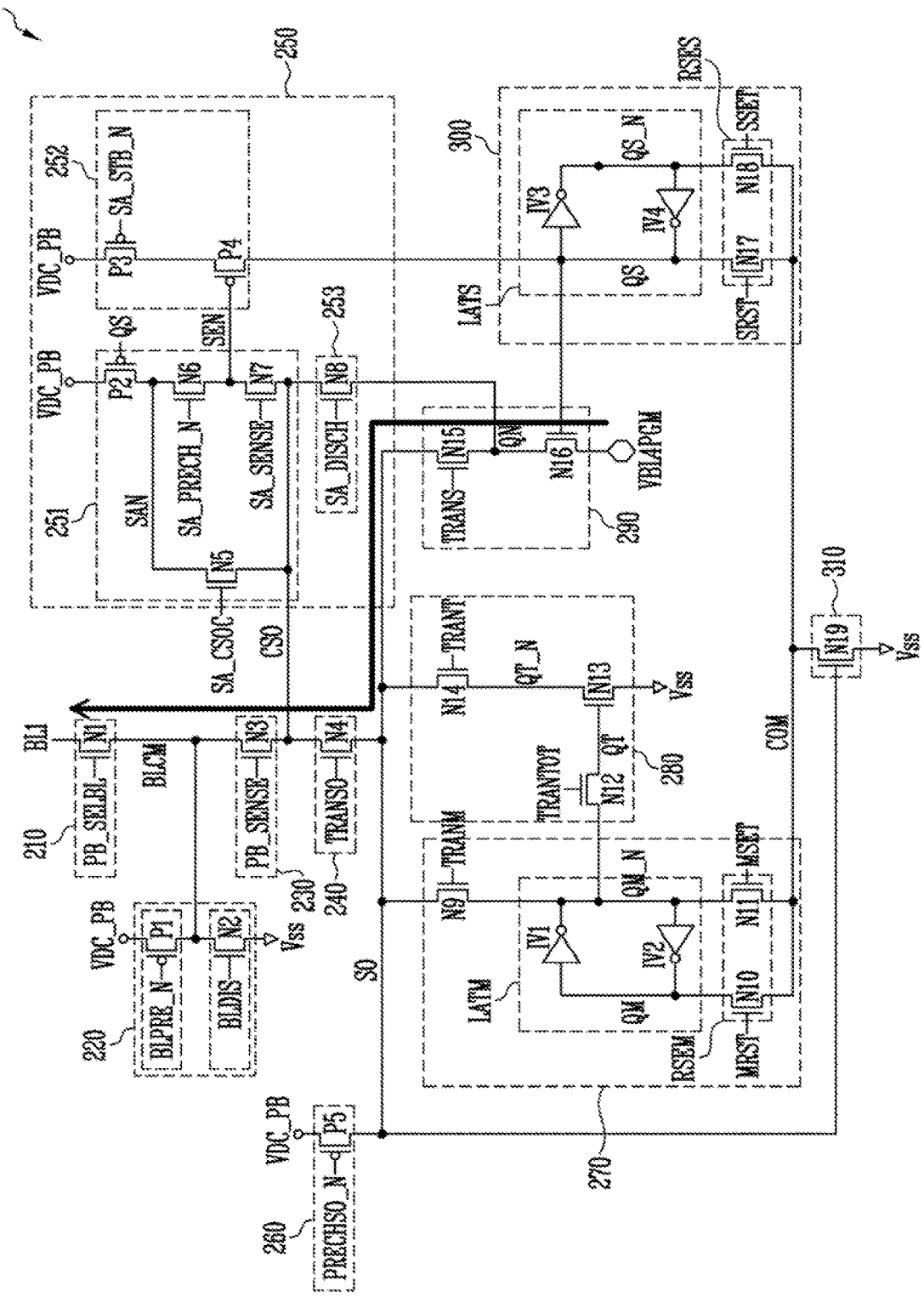
FIG. 3 is a circuit diagram illustrating a page buffer of FIG. 1.

FIG. 3 is a circuit diagram illustrating a page buffer of FIG. 1.

The page buffers PB1 to PBk may be the same. Therefore, only the page buffer PB1 of them will be described herein as an example.

Referring to FIG. 3, a page buffer PB1 may include a bit line coupling circuit 210, a bit line setup circuit 220, a page buffer sensing circuit 230, a sensing node coupling circuit 240, a current control circuit 250, a sensing node precharge circuit 260, a main latch 270, a dynamic latch 280, an enable voltage supply circuit 290, a latch circuit 300 and a discharge circuit 310.

The bit line coupling circuit 210 may be coupled between the bit line BL1 and a bit line coupling node BLCM, and may include an NMOS transistor N1 which operates in response to a bit line select signal PB_SELBL. The NMOS transistor N1 may be turned on or off in response to the bit line select signal PB_SELBL.

The bit line setup circuit 220 may be coupled between an internal power VDC_PB, a ground power Vss and the bit line coupling node BLCM. The bit line setup circuit 220 may include an NMOS transistor N2 which operates in response to a bit line discharge signal BLDIS, and a PMOS transistor P1 which operates in response to a bit line precharge signal BNPRE_N. The NMOS transistor N2 may be turned on or off in response to the bit line discharge signal BLDIS, and may transfer the ground power Vss to the bit line coupling node BLCM. The PMOS transistor P1 may transfer the internal power VDC_PB to the bit line coupling node BLCM in response to the bit line precharge signal BLPRE_N.

The page buffer sensing circuit 230 may be coupled between the bit line coupling node BLCM and a current sensing node CSO, and may include an NMOS transistor N3 which operates in response to a page buffer sensing signal PB_SENSE. The NMOS transistor N3 may be turned on or off in response to the page buffer sensing signal PB_SENSE.

The sensing node coupling circuit 240 may be coupled between the current sensing node CSO and a sensing node SO, and may include an NMOS transistor N4 which operates in response to a node coupling signal TRANSO. The NMOS transistor N4 may be turned on or off in response to the node coupling signal TRANSO.

The current control circuit 250 may include a clamp circuit 251, a current determination circuit 252 and a discharge circuit 253.

The clamp circuit 251 may include NMOS transistors N5 to N7 and a PMOS transistor P2. The PMOS transistor P2 may be coupled between the internal power VDC_PB and a sense amplifier node SAN, and may be turned on or off in response to a potential of a first node QS of the latch circuit 300. The NMOS transistor N5 may be coupled between the PMOS transistor P2 and the current sensing node CSO, and may transfer sensing current for sensing the bit line BL1 to the current sensing node CSO in response to a current sensing signal SA_CSOC. The NMOS transistor N6 may be coupled between the sense amplifier node SAN and an internal sensing node SEN, and may transfer the internal power VDC_PB to the internal sensing node SEN in response to an internal sensing node precharge signal SA_P-RECH_N. The NMOS transistor N7 may be coupled between the internal sensing node SEN and the current sensing node CSO, and may couple the internal sensing node SEN to the current sensing node CSO in response to an internal sensing node sensing signal SA_SENSE.

The current determination circuit 252 may include PMOS transistors P3 and P4. The PMOS transistor P3 may be coupled between the internal power VDC_PB and the PMOS transistor P4, and may be turned on or off in response to a sense amplifier strobe signal SA_STB_N. The PMOS transistor P4 may be coupled between the PMOS transistor P3 and the first node QS of the latch circuit 300, and may be turned on or off in response to a potential level of the internal sensing node SEN.

The sensing discharge circuit 253 may be coupled between the current sensing node CSO and a node QN of the enable voltage supply circuit 290, and may be turned on or off in response to an internal sensing node discharge signal SA_DISCH.

The sensing node precharge circuit 260 may be coupled between the internal power VDC_PB and the sensing node SO, and may include a PMOS transistor P5 which operates in response to a precharge signal PRECHSO_N. The PMOS transistor P5 may transfer the internal power VDC_PB to the sensing node SO in response to the precharge signal PRECHSO_N.

The main latch 270 may include an NMOS transistor N9, a latch LATM and a main latch reset/setup circuit RSEM. The main latch 270 may receive the inputted program data and temporarily store them.

The NMOS transistor N9 may couple the sensing node SO to a first main node QM_N of the latch LATM in response to a main data transmission signal TRANM.

The latch LATM may include inverters IV1 and IV2. The inverters IV1 and IV2 may be coupled in parallel to each other between first and second main nodes QM_N and QM of the latch LATM. An input terminal of the inverter IV1 may be coupled to the second main node QM, and an output terminal thereof may be coupled to the first main node QM_N. An input terminal of the inverter IV2 may be coupled to the first main node QM_N, and an output terminal thereof may be coupled to the second main node QM.

The main latch reset/setup circuit RSEM may be coupled to the first and second main nodes QM_N and QM of the latch LATM, and may reset or set up the latch LATM. For instance, the main latch reset/setup circuit RSEM may include NMOS transistors N10 and N11. The NMOS transistor N10 may couple the second main node QM of the latch LATM to a common node COM in response to a main reset signal MRST. The NMOS transistor N11 may couple the first main node QM_N of the latch LATM to the common node COM in response to the main setup signal MSET. During an initialization operation of the latch LATM, the main latch reset/setup circuit RSEM couples, in response to the main reset signal MRST, the second main node QM to the common node COM coupled with the ground power Vss, and thus initializes the latch LATM such that the second main node QM comes to have a low level and the first main node QM_N comes to have a high level. During a program data input operation, the main latch reset/setup circuit RSEM may maintain or invert logic levels of the first and second main nodes QM_N and QM in response to the main setup signal MSET, the logic level of which is determined depending on a program data value.

The dynamic latch 280 may include NMOS transistors N12, N13 and N14. The dynamic latch 280 may store program operation information. For instance, the dynamic latch 280 may store any one of Multi Level Cell (MLC), Triple Level Cell (TLC) and Quad Level Cell (QLC) program operation information.

The NMOS transistor N12 may couple the first main node QM_N to a dynamic node QT in response to a dynamic data transmission signal TRANTOT. The NMOS transistor N13 may be coupled between the NMOS transistor N14 and the ground power Vss, and may be turned on or off in response to the potential of the dynamic node QT. The NMOS transistor N14 may be coupled between the sensing node SO and the NMOS transistor N13, and may be turned on or off in response to a dynamic data transmission signal TRANT.

During a program operation, the enable voltage supply circuit 290 may transfer a program-dedicated voltage VBL4PGM to the bit line BL1 through the sensing node SO when the second program enable voltage is applied to the bit line BL1. The enable voltage supply circuit 290 may include NMOS transistors N15 and N16 that are coupled in series between the sensing node SO and the program-dedicated voltage VBL4PGM. The NMOS transistor N15 may be turned on or off in response to a transmission signal TRANS, and the NMOS transistor N16 may be turned on or off in response to the potential of the first node QS of the latch circuit 300.

During the program operation, the enable voltage supply circuit 290 may control a program speed of a corresponding memory cell. Also, the enable voltage supply circuit 290 may apply the second program enable voltage, which is higher than the first program enable voltage (the ground power Vss), to the bit line BL1 depending on a program status to be programmed, thus controlling the potential level of the bit line BL1.

The latch circuit 300 may include a sensing latch LATS and a sensing latch reset/setup unit RSES. The sensing latch LATS may include inverters IV3 and IV4. The inverters IV3 and IV4 may be coupled in parallel to each other between a first sensing node QS and a second sensing node QS_N of the sensing latch LATS. For instance, an input terminal of the inverter IV3 may be coupled to the first sensing node QS, and an output terminal thereof may be coupled to the second sensing node QS_N. An input terminal of the inverter IV4 may be coupled to the second sensing node QS_N, and an output terminal thereof may be coupled to the first sensing node QS.

The sensing latch reset/setup unit RSES may be coupled to the first and second sensing nodes QS and QS_N of the sensing latch LATS, and may reset or set up the sensing latch LATS. For instance, the sensing latch reset/setup unit RSES may include NMOS transistors N17 and N18. The NMOS transistor N17 may couple the first sensing node QS of the sensing latch LATS to the common node COM in response to a sensing reset signal SRST. The NMOS transistor N18 may couple the second sensing node QS_N of the sensing latch LATS to the common node COM in response to a sensing setup signal SSET. During a reset operation or setup operation of the sensing latch LATS, the common node COM may be coupled to the ground power Vss.

The discharge circuit 310 may be coupled between the common node COM and the ground power Vss, and may include an NMOS transistor N19 which is turned on or off depending on the potential of the sensing node SO.

The page buffer PB1 according to the above description may perform a bit line setup operation during the program operation. The bit line setup operation may include a first bit line setup operation and a second bit line setup operation. For instance, the page buffer PB1 may sequentially perform the first bit line setup operation of applying a program inhibit voltage (for example, having the level of the internal power VDC_PB) or a first program enable voltage (for example, having the level of the ground power Vss) to the corresponding bit line BL1 depending on a data value to be programmed, and the second bit line setup operation of applying a second program enable voltage higher than the first program enable voltage (having the level of the ground power Vss) to the bit line BL1 depending on the program speed of a corresponding memory cell and program status to be programmed, after the first program enable voltage is applied to the bit line BL1.

In order to perform the second bit line setup operation, each of the page buffers PB1 to PBk having the structure described with reference to FIG. 3 should include a terminal to which the program-dedicated voltage VBL4PGM is applied.

Figure 4:
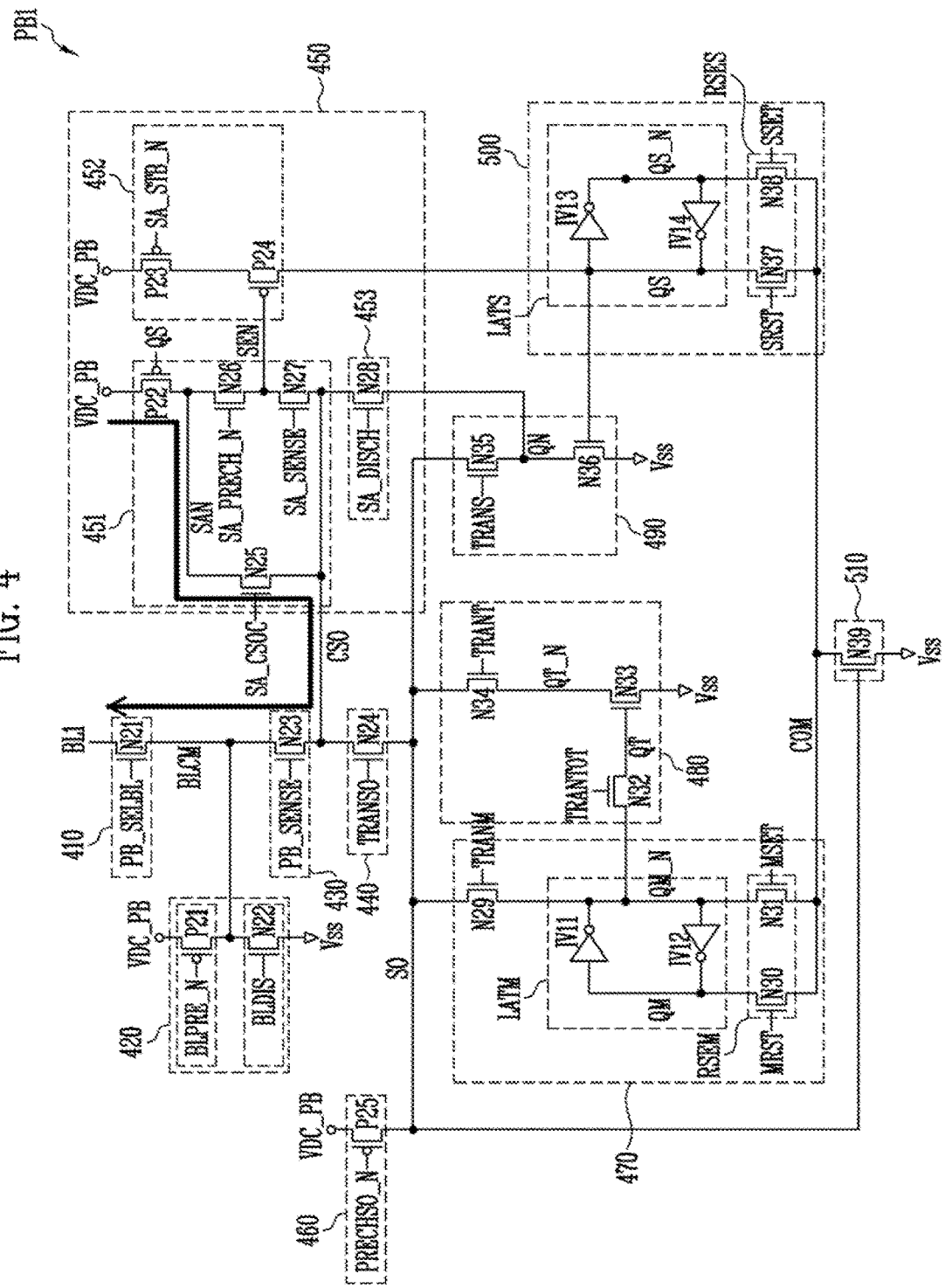
FIG. 4 is a circuit diagram illustrating another embodiment of the page buffer of FIG. 1.

FIG. 4 is a circuit diagram illustrating another embodiment of the page buffer of FIG. 1.

The page buffers PB1 to PBk may be the same as one another; therefore, only the page buffer PB1 will be described herein as an example.

Referring to FIG. 4, a page buffer PB1 may include a bit line coupling circuit 410, a bit line setup circuit 420, a page buffer sensing circuit 430, a sensing node coupling circuit 440, a current control circuit 450, a sensing node precharge circuit 460, a main latch 470, a dynamic latch 480, a first discharge circuit 490, a latch circuit 500 and a second discharge circuit 510.

The bit line coupling circuit 410 may be coupled between the bit line BL1 and a bit line coupling node BLCM, and may include an NMOS transistor N21 which operates in response to a bit line select signal PB_SELBL. The NMOS transistor N21 may be turned on or off in response to the bit line select signal PB_SELBL.

The bit line setup circuit 420 may be coupled between an internal power VDC_PB, a ground power Vss and the bit line coupling node BLCM. The bit line setup circuit 420 may include an NMOS transistor N22 which operates in response to a bit line discharge signal BLDIS, and a PMOS transistor P21 which operates in response to a bit line precharge signal BLPRE_N. The NMOS transistor N22 may be turned on or off in response to the bit line discharge signal BL_DIS, and may transfer the ground power Vss to the bit line coupling node BLCM. The PMOS transistor P21 may apply the internal power VDC_PB to the bit line coupling node BLCM in response to the bit line precharge signal BLPRE_N.

The page buffer sensing circuit 430 may be coupled between the bit line coupling node BLCM and a current sensing node CSO, and may include an NMOS transistor N23 which operates in response to a page buffer sensing signal PB_SENSE. The NMOS transistor N23 may be turned on or off in response to the page buffer sensing signal PB_SENSE.

The sensing node coupling circuit 440 may be coupled between the current sensing node CSO and a sensing node SO, and may include an NMOS transistor N24 that operates in response to a nod coupling signal TRANSO. The NMOS transistor N24 may be turned on or off in response to the node coupling signal TRANSO.

The current control circuit 450 may include a clamp circuit 451, a current determination circuit 452 and a discharge circuit 453.

The clamp circuit 451 may include NMOS transistors N25 to N27 and a PMOS transistor P22. The PMOS transistor P22 may be coupled between the internal power VDC_PB and a sense amplifier node SAN, and may be turned on or off in response to a potential of a first node QS of the latch circuit 500. The NMOS transistor N25 may be coupled between the PMOS transistor P22 and the current sensing node CSO, and may transfer sensing current for sensing the bit line BL1 to the current sensing node CSO in response to a current sensing signal SA_CSOC. The NMOS transistor N26 may be coupled between the sense amplifier node SAN and an internal sensing node SEN, and may transfer the internal power VDC_PB to the internal sensing node SEN in response to an internal sensing node precharge signal SA_PRECH_N. The NMOS transistor N27 is coupled between the internal sensing node SEN and the current sensing node CSO, and may couple the internal sensing node SEN to the current sensing node CSO in response to an internal sensing node sensing signal SA_SENSE.

The page buffer sensing circuit 430 and the clamp circuit 451 may transfer the second program enable voltage to the bit line BL1 using the internal power VDC_PB during the second bit line setup operation of the program operation. For instance, during the second bit line setup operation, the clamp circuit 451 may transfer the internal power VDC_PB to the current sensing node CSO, and the page buffer sensing circuit 430 may transfer the second program enable voltage to the bit line BL1 in response to the page buffer sensing signal PB_SENSE which is higher than the second program enable voltage by a threshold voltage of the NMOS transistor N23.

The current determination circuit 452 may include PMOS transistors P23 and P24. The PMOS transistor P23 may be coupled between the internal power VDC_PB and the PMOS transistor P24, and may be turned on or off in response to a sense amplifier strobe signal SA_STB_N. The PMOS transistor P24 may be coupled between the PMOS transistor P23 and the first node QS of the latch circuit 500, and may be turned on or off in response to a potential level of the internal sensing node SEN.

The sensing discharge circuit 453 is coupled between the current sensing node CSO and a node QN of the first discharge circuit 490, and may be turned on or off in response to an internal sensing node discharge signal SA_DISCH.

The sensing node precharge circuit 460 may be coupled between the internal power VDC_PB and the sensing node SO, and may include a PMOS transistor P25 which operates in response to a precharge signal PRECHSO_N. The PMOS transistor P25 may transfer the internal power VDC_PB to the sensing node SO in response to the precharge signal PRECHSO_N.

The main latch 470 may include an NMOS transistor N29, a latch LATM and a main latch reset/setup circuit RSEM. The main latch 470 may receive program data and temporarily store them.

The NMOS transistor N29 may couple the sensing node SO to a first main node QM_N of the latch LATM in response to a main data transmission signal TRANM.

The latch LATM may include inverters IV11 and IV12. The inverters IV11 and IV12 may be coupled in parallel to each other between the first main node QM_N and a second main node QM of the latch LATM. An input terminal of the inverter IV11 may be coupled to the second main node QM, and an output terminal thereof may be coupled to the first main node QM_N. An input terminal of the inverter IV12 may be coupled to the first main node QM_N, and an output terminal thereof may be coupled to the second main node QM.

The main latch reset/setup circuit RSEM may be coupled to the first and second main nodes QM_N and QM of the latch LATM, and may reset or set up the latch LATM. For instance, the main latch reset/setup circuit RSEM may include NMOS transistors N30 and N31. The NMOS transistor N30 may couple the second main node QM of the latch LATM to a common node COM in response to a main reset signal MRST. The NMPS transistor N31 may couple the first main node QM_N of the latch LATM to the common node COM in response to a main setup signal MSET. During an initialization operation of the latch LATM, the main latch reset/setup circuit RSEM couples, in response to the main reset signal MRST, the second main node QM to the common node COM coupled with the ground power Vss, and thus initializes the latch LATM such that the second main node QM comes to have a low level and the first main node QM_N comes to have a high level. During a program data input operation, the main latch reset/setup circuit RSEM may maintain or invert logic levels of the second and first main nodes QM and QM_N in response to the main setup signal MSET, the logic levels of which is determined depending on a program data value.

The dynamic latch 480 may include NMOS transistors N32, N33 and N34. The dynamic latch 480 may store program operation information. For instance, the dynamic latch 480 may store any one of Multi Level Cell (MLC), Triple Level Cell (TLC) and Quad Level Cell (QLC) program operation information.

The NMOS transistor N32 may couple the first main node QM_N to a dynamic node QT in response to dynamic data transmission signal TRANTOT. The NMOS transistor N33 may be coupled between the NMOS transistor N34 and the ground power Vss, and may be turned on or off in response to the potential of the dynamic node QT. The NMOS transistor N34 may be coupled between the sensing node SO and the NMOS transistor N33, and may be turned on or off in response to a dynamic data transmission signal TRANT.

During a program operation, the first discharge circuit 490 may discharge the current sensing node CSO or the sensing node SO. The first discharge circuit 490 may include NMOS transistors N35 and N36 that are coupled in series between the sensing node SO and the ground power Vss. The NMOS transistor N35 may be turned on or off in response to a transmission signal TRANS, and the NMOS transistor N36 may be turned on or off in response to the potential of the first node QS of the latch circuit 500.

The latch circuit 500 may include a sensing latch LATS and a sensing latch reset/setup unit RSES. The sensing latch LATS may include inverters IV13 and IV14. The inverters IV13 and IV14 may be coupled in parallel to each other between the first sensing node QS and a second sensing node QS_N of the sensing latch LATS. For instance, an input terminal of the inverter IV13 may be coupled to the first sensing node QS, and an output terminal thereof may be coupled to the second sensing node QS_N. An input terminal of the inverter IV14 may be coupled to the second sensing node QS_N, and an output terminal thereof may be coupled to the first sensing node QS.

The sensing latch reset/setup unit RSES may be coupled to the first and second sensing nodes QS and QS_N of the sensing latch LATS, and may reset or set up the sensing latch LATS. For instance, the sensing latch reset/setup unit RSES may include NMOS transistors N37 and N38. The NMOS transistor N37 may couple the first sensing node QS of the sensing latch LATS to the common node COM in response to a sensing reset signal SRST. The NMOS transistor N38 may couple the second sensing node QS_N of the sensing latch LATS to the common node COM in response to a sensing setup signal SSET. During a reset operation or setup operation of the sensing latch LATS, the common node COM may be coupled to the ground power Vss.

The second discharge circuit 510 may be coupled between the common node COM and the ground power Vss, and may include an NMOS transistor N39 which is turned on or off depending on the potential of the sensing node SO.

Figure 5:
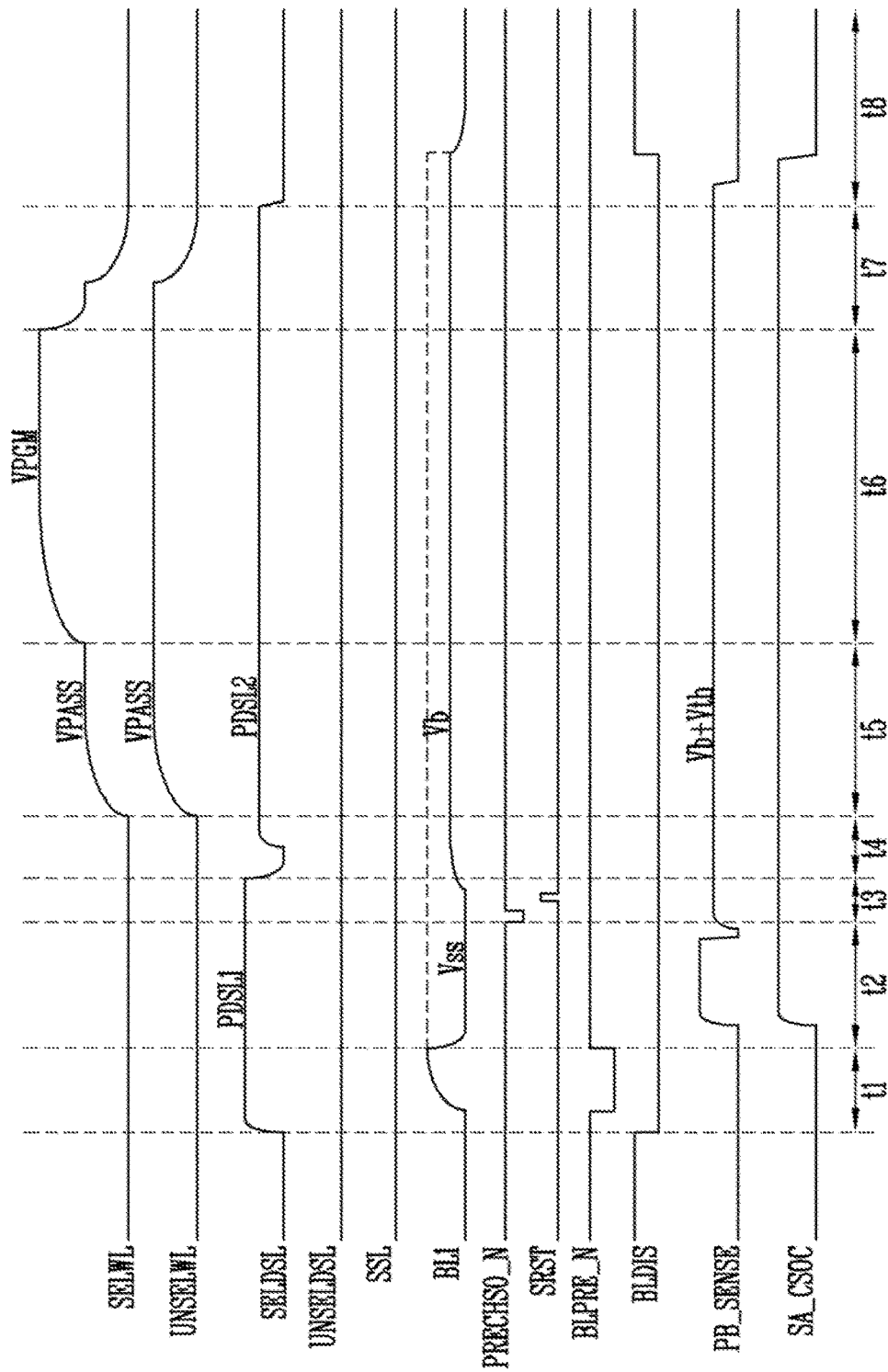
FIG. 5 is a waveform diagram illustrating an operation of the page buffer of FIG. 4.

FIG. 5 is a waveform diagram illustrating an operation of the page buffer of FIG. 4.

The operation of the semiconductor memory device using the page buffer according to an embodiment of the present disclosure will be described with reference to FIGS. 1, 2, 4 and 5.

During the program operation, the control logic 140 controls the page buffer circuit 130, the voltage generating circuit 150 and the address decoder 120 in response to a command CMD corresponding to the program operation Each of the page buffers PB1 to PBk that are included in the page buffer circuit 130 temporarily stores program data DATA in the main latch 470.

During a period from t1 to t3, the voltage generating circuit 150 may generate a first operation voltage PDSL1 to be applied to the drain select line SELDSL of a selected memory block 110MB. The address decoder 120 may apply the first operation voltage PDSL1 to the drain select line SELDSL of the selected memory block 110MB in response to an address ADDR. Thereby, the plurality of the cell strings ST1 to STk that are included in the selected memory block 110MB may be electrically coupled to the corresponding bit lines BL1 to BLk.

The bit line setup circuit 420 of each of the page buffers PB1 to PBk included in the page buffer circuit 130 may precharge the bit lines BL1 to BLk to a high level in response to the bit line precharge signal BLPRE_N that is applied as a low level in the period t1.

Thereafter, the first bit line setup operation may be performed in the period t2. Each of page buffers PB1 to PBk may adjust the potential level of the sensing node SO to a high level or a low level depending on a data value stored in the main latch 470. The page buffer sensing circuit 430 and the sensing node coupling circuit 440 may couple the sensing node SO to the bit line BL1 in response to the page buffer sensing signal PB_SENSE and the nod coupling signal TRANSO, respectively, thus adjusting the potential level of the bit line BL1. The potential level of the page buffer sensing signal PB_SENSE which is applied during the first bit line setup operation may be defined as a first level. For example, depending on program data, if the program inhibit voltage is applied to the bit line BL1, the potential level of the bit line BL1 may be maintained to the level of the internal power VDC_PB, and if the first program inhibit voltage is applied to the bit line BL1, the potential level thereof is discharged to the level of the ground power Vss.

Thereafter, the second bit line setup operation may be performed in the period t3. The sensing node precharge circuit 460 of each of the page buffers PB1 to PBk may precharge the sensing node SO to the level of the internal power VDC_PB in response to the precharge signal PRECHSO_N which is applied as a low level during a predetermined time. Therefore, the second discharge circuit 510 may apply the ground power Vss to the common node COM. Subsequently, the sensing latch reset/setup unit RSES may initialize the first sensing node QS of the sensing latch LATS to a low level in response to the sensing reset signal SRST.

Thereby, the PMOS transistor P22 of the clamp circuit 451 may be turned on, and the NMOS transistor N25 may apply the internal power VDC_PB to the current sensing node CSO in response to the current sensing signal SA_C-SOC.

The page buffer sensing circuit 430 may apply the second program enable voltage Vb to the bit line BL1 in response to the page buffer sensing signal PB_SENSE which is higher than the second program enable voltage Vb by the threshold voltage Vth of the NMOS transistor N23. The potential level of the page buffer sensing signal PB_SENSE which is applied during the second bit line setup operation may be defined as a second level lower than the first level of the page buffer sensing signal PB_SENSE.

In a period t4, the voltage generating circuit 150 may discharge the first operation voltage PDSL1 and then generate a second operation voltage PDSL2 having a potential level lower than that of the first operation voltage PDSL1. The address decoder 120 may apply the second operation voltage PDSL2 to the drain select line SELDSL of the selected memory block.

Thereafter, the voltage generating circuit 150 may generate a pass voltage Vpass in a period t5, and the address decoder 120 may apply the pass voltage Vpass to the word lines SELWL and UNSELWL of the selected memory block 110MB. The voltage generating circuit 150 may generate a program voltage Vpgm in a period t6, and the address decoder 120 may apply the program voltage Vpgm to the selected word line SELWL. Thereafter, the voltage generating circuit 150 may discharge the potential levels of the word lines SELWL and UNSELWL of the selected memory block 110MB.

The control logic 140 disables, in a period t8, the signals that have been applied to the page buffers PB1 to PBk.

As the described above, during the program operation of the semiconductor memory device according to the present disclosure, the page buffers may control the potential levels of the corresponding bit lines to the second program enable voltage using the internal power during the bit line setup period. Therefore, the page buffers may not require the program-dedicated voltage terminal for application of the second program enable voltage. Furthermore, power resistance of the page buffers may be improved.

Figure 6:
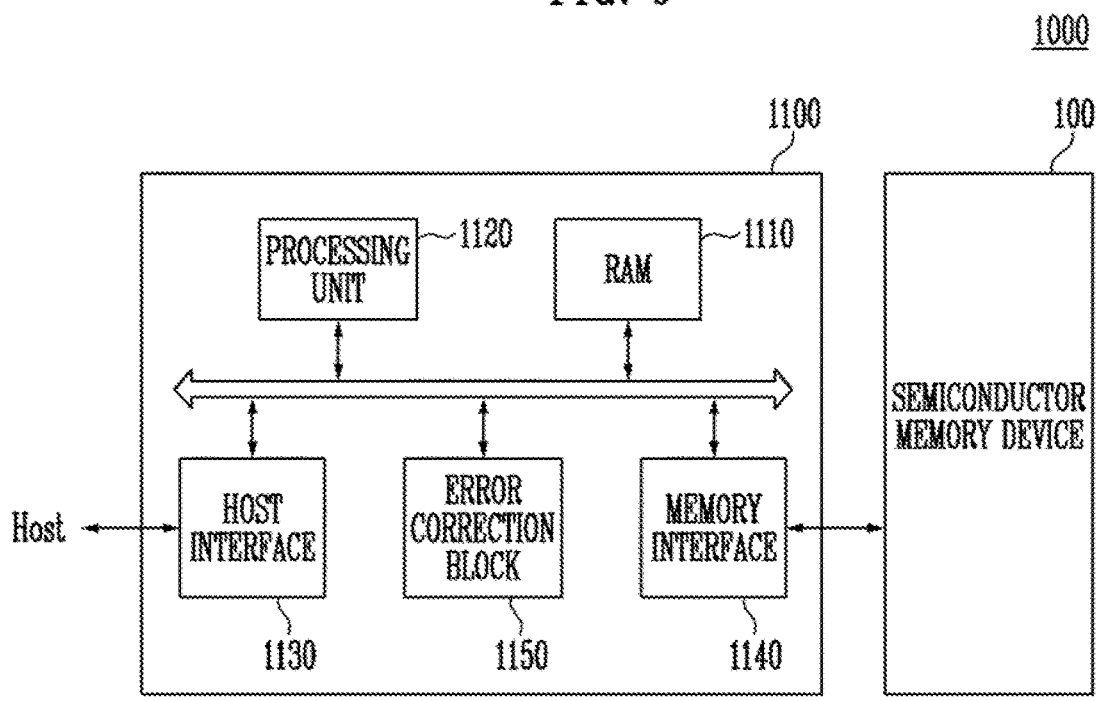
FIG. 6 is a block diagram showing a memory system including the semiconductor memory device of FIG. 1, according to an embodiment of the present invention.

FIG. 6 illustrates a memory system including the semiconductor memory device 100 of FIG. 1.

Referring FIG. 6, the memory system 1000 includes a semiconductor memory device 100 and a controller 1100.

The semiconductor memory device 100 may have the same configuration and operation as those of the semiconductor memory device described with reference to FIG. 1. Particularly, the semiconductor memory device 100 may include a page buffer circuit 130 having a plurality of page buffers wherein each buffer is buffer PB1 described in FIG. 4. Hereinafter, repetitive explanations will be omitted.

The controller 1100 is coupled to a host Host and the semiconductor memory device 100. The controller 1100 is configured to access the semiconductor memory device 100 in response to a request from the host Host. For example, the controller 1100 is configured to control read, write, erase, and background operations of the semiconductor memory device 100. The controller 1100 is configured to provide an interface between the host Host and the semiconductor memory device 100. The controller 1100 is configured to drive firmware for controlling the semiconductor memory device 100.

The controller 1100 includes a RAM (Random Access Memory) 1110, a processing unit 1120, a host interface 1130, a memory interface 1140, and an error correction block 1150. The RAM 1110 is used as at least one of an operation memory of the processing unit 1120, a cache memory between the semiconductor memory device 100 and the host Host, and a buffer memory between the semiconductor memory device 100 and the host Host. The processing unit 1120 controls the overall operation of the controller 1100. In addition, the controller 1100 may temporarily store program data provided from the host Host during the write operation.

The host interface 1130 includes a protocol for performing data exchange between the host Host and the controller 1100. In an exemplary embodiment, the controller 1200 is configured to communicate with the host Host through at least one of various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol, a private protocol, and the like.

The memory interface 1140 interfaces with the semiconductor memory device 100. For example, the memory interface includes a NAND interface or NOR interface.

The error correction block 1150 uses an error correcting code (ECC) to detect and correct an error in data received from the semiconductor memory device 100. The processing unit 1120 may adjust the read voltage according to an error detection result from the error correction block 1150, and control the semiconductor memory device 100 to perform re-reading. In an exemplary embodiment, the error correction block may be provided as an element of the controller 1100.

The controller 1100 and the semiconductor memory device 100 may be integrated into a single semiconductor device. In an exemplary embodiment, the controller 1100 and the semiconductor memory device 100 may be integrated into a single semiconductor device to form a memory card. For example, the controller 1100 and the semiconductor memory device 100 may be integrated into a single semiconductor device and form a memory card such as a personal computer memory card international association (PCMCIA), a compact flash card (CF), a smart media card (SM or SMC), a memory stick, a multimedia card (MMC, RS-MMC, or MMCmicro), a SD card (SD, miniSD, microSD, or SDHC), a universal flash storage (UFS), and the like.

The controller 1100 and the semiconductor memory device 100 may be integrated into a single semiconductor device to form a solid state drive (SSD). The SSD includes a storage device formed to store data in a semiconductor memory. When the memory system 1000 is used as the SSD, an operation speed of the host Host coupled to the memory system 2000 may be phenomenally improved.

In another embodiment, the memory system 1000 may be provided as one of various elements of an electronic device such as a computer, a ultra mobile PC (UMPC), a workstation, a net-book, a personal digital assistants (PDA), a portable computer, a web tablet, a wireless phone, a mobile phone, a smart phone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

In an exemplary embodiment, the semiconductor memory device 100 or the memory system 1000 may be embedded in various packages such as a Package on Package (PoP), Ball grid arrays (BGAs), Chip scale packages (CSPs), a Plastic Leaded Chip Carrier (PLCC), a Plastic Dual In Line Package (PDIP), a Die in Waffle Pack, Die in Wafer Form, a Chip On Board (COB), a Ceramic Dual In Line Package (CERDIP), a Plastic Metric Quad Flat Pack (MQFP), a Thin Quad Flatpack (TQFP), a Small Outline (SOIC), a Shrink Small Outline Package (SSOP), a Thin Small Outline (TSOP), a Thin Quad Flatpack (TQFP), a System In Package (SIP), a Multi Chip Package (MCP), a Wafer-level Fabricated Package (WFP), a Wafer-Level Processed Stack Package (WSP), or the like.

Figure 7:
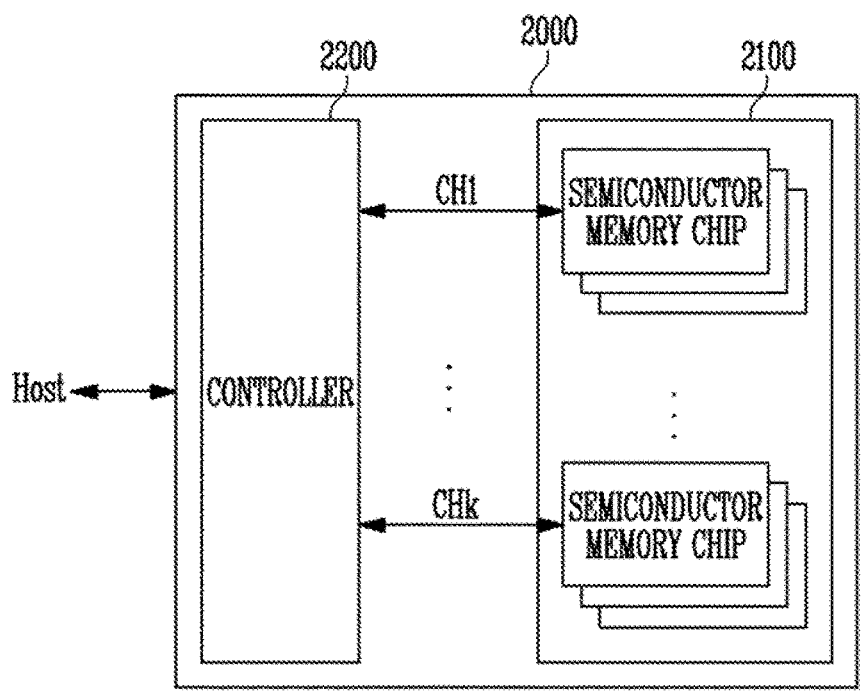
FIG. 7 is a block diagram showing an application example of the memory system of FIG. 6, according to an embodiment of the present invention.

FIG. 7 illustrates a memory system 2000 according to another embodiment of the present invention.

The memory system 2000 includes the semiconductor memory device 2100 and a controller 2200. The semiconductor memory device 2100 includes a plurality of memory chips. The semiconductor memory chips are divided into a plurality of groups.

In FIG. 7, it is illustrated that the respective groups communicate with the controller 2200 through first to k-th channels CH1 to CHk. Each semiconductor memory chip may have the same configuration and operation as those of an embodiment of the semiconductor memory device 100 described with reference to FIGS. 1 and 4.

Each group communicates with the controller 2200 through one common channel. The controller 2200 may have the same configuration as that of the controller 1100 described with reference to FIG. 6. The controller 2200 is configured to control a plurality of memory chips of the semiconductor memory device 2100 through the plurality of channels CH1 to CHk.

Figure 8:
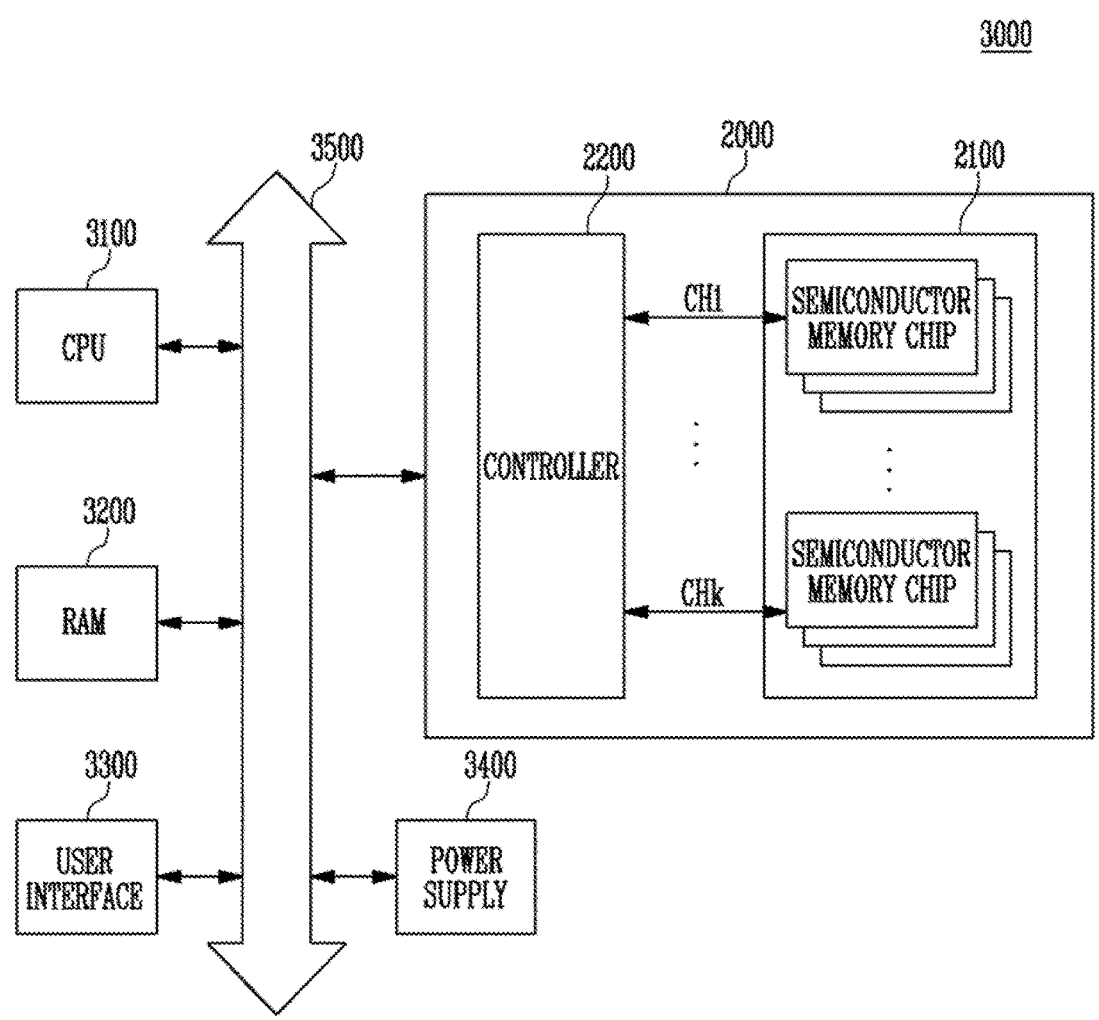
FIG. 8 is a block diagram showing a computing system including the memory system illustrated with reference to FIG. 7, according to an embodiment of the present invention.

FIG. 8 illustrates a computing system including the memory system 2000 of FIG. 7, according to an embodiment of the present invention.

Referring to FIG. 8, the computing system 3000 may include a central processing unit 3100, a RAM 3200, a user interface 3300, a power supply 3400, a system bus 3500, and a memory system 2000.

The memory system 2000 is electrically coupled to the CPU 3100, the RAM 3200, the user interface 3300, and the power supply 3400 through the system bus 3500. Data provided through the user interface 3300 or processed by the CPU 3100 is stored in the memory system 2000.

In FIG. 8, the semiconductor memory device 2100 is illustrated as being coupled to the system bus 3500 through the controller 2200. However, the semiconductor memory device 2100 may be directly coupled to the system bus 3500 in which case the functions of the controller 2200 may be performed by the CPU 3100 and the RAM 3200.

In FIG. 8, the computing system 3000 employs the memory system 2000 of FIG. 7. However, in a variation of the illustrated embodiment, the memory system 2000 may be replaced with the memory system 1000 of FIG. 6. In yet another embodiment, the computing system 3000 may include both of the memory systems 1000 and 2000.

According to the present disclosure, the potential level of a bit line is controlled during a program operation of the semiconductor memory device to thereby mitigate a disturb phenomenon, and improve power resistance of the page buffer.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A page buffer for a semiconductor memory device, the page buffer comprising:
   a latch circuit comprising a first node configured to be set to a first level in response to a sense amplifier strobe signal when an operation of setting up a bit line is performed during a program operation of a semiconductor memory device;
   a current control circuit suitable for transferring an internal power of the semiconductor memory device to a current sensing node depending on a potential level of the first node; and
   a page buffer sensing circuit suitable for coupling the bit line to the current sensing node in response to a page buffer sensing signal, controlling the bit line by a first program enable voltage in response to the page buffer sensing signal of a first potential level during a first bit line setup operation of the operation of setting up the bit line, and controlling the bit line by a second program enable voltage higher than the first program enable voltage in response to the page buffer sensing signal of a second potential level lower than the first potential level during a second bit line setup operation of the operation of setting up the bit line,
   wherein the first node is set to the first level by applying the internal power to the first node in response to the sense amplifier strobe signal during a second bit line setup operation of the program operation after a first bit line setup operation of the program operation has been completed.

2. The page buffer according to claim 1, wherein the first bit line setup operation and the second bit line setup operation are sequentially performed.

3. The page buffer according to claim 2, further comprising a main latch suitable for temporarily storing program data inputted from an outside during the program operation, and applying the first program enable voltage or a program inhibit voltage to the bit line during the first bit line setup operation depending on the temporarily stored program data.

4. The page buffer according to claim 1, wherein the page buffer sensing signal of the second potential level has a potential level higher than the second program enable voltage by a set threshold voltage.

5. The page buffer according to claim 1, wherein the current control circuit comprises:
a clamp circuit coupled between the internal power and the current sensing node, and suitable for transferring the internal power to the current sensing node in response to a current sensing signal and the level of the first node; and
a current determination circuit coupled between the internal power and the first node, and suitable for transferring the internal power to the first node in response to the sense amplifier strobe signal.

6. A page buffer of a semiconductor memory device, the page buffer comprising:
a main latch suitable for temporarily storing program data inputted from an outside during a program operation, and controlling a potential level of a sensing node in accordance with the program data;
a page buffer sensing circuit suitable for adjusting a potential level of a bit line to a program inhibit level or a first program enable voltage level depending on a page buffer sensing signal of a first potential level and the potential level of the sensing node during a first bit line setup operation of the program operation;
a latch circuit comprising a first node configured to be set to a first level by applying an internal power to the first node in response to a sense amplifier strobe signal during a second bit line setup operation after the first bit line setup operation has been completed; and
a current control circuit suitable for supplying the internal power to a current sensing node depending on a level of the first node of the latch circuit,
wherein the page buffer sensing circuit adjusts the potential level of the bit line to a second program enable voltage level in response to the page buffer sensing signal of a second potential level higher than the first potential level during the second bit line setup operation.

7. The page buffer according to claim 6, wherein the second program enable voltage level is higher than the first program enable voltage level.

8. The page buffer according to claim 6, wherein the page buffer sensing signal of the second potential level has a potential level higher than the second program permit voltage by a set threshold voltage.

9. The page buffer according to claim 6, wherein the current control circuit comprises:
a clamp circuit coupled between the internal power and the current sensing node, and suitable for transferring the internal power to the current sensing node in response to a current sensing signal and the level of the first node; and
a current determination circuit coupled between the internal power and the first node, and suitable for transferring the internal power to the first node in response to the sense amplifier strobe signal.

10. A semiconductor memory device comprising:
a memory cell array including a plurality of memory blocks;
a voltage generating circuit suitable for generating a program voltage and a pass voltage to be supplied to word lines of the memory cell array;
a page buffer circuit coupled to bit lines of the memory cell array, and suitable for performing a bit line setup operation of applying a program enable voltage or a program inhibit voltage to the bit lines depending on program data; and
a control logic suitable for controlling the voltage generating circuit and the page buffer circuit to perform a program operation to the memory cell array in response to a command,
wherein the page buffer circuit applies a first program enable voltage to a bit line in response to a page buffer sensing signal of a first potential level during a first bit line setup operation of the bit line setup operation and applies a second program enable voltage to the bit line in response to the page buffer sensing signal of a second potential level lower than the first potential level during a second bit line setup operation of the bit line setup operation when the first and second program enable voltages are applied to the bit lines during the bit line setup operation,
wherein the page buffer circuit comprises a plurality of page buffers coupled to the respective bit lines, and
wherein each of the page buffers comprises:
a latch circuit comprising a first node;
a current control circuit suitable for transferring an internal power to a current sensing node depending on a level of the first node, which is set to a first level according to a sense amplifier strobe signal during an operation of setting up a corresponding bit line; and
a page buffer sensing circuit suitable for coupling the corresponding bit line to the current sensing node in response to the page buffer sensing signal of the first potential level or the page buffer sensing signal of the second potential level, and controlling a potential level of the corresponding bit line depending on a potential level of the page buffer sensing signal,
wherein the first node is set to the first level by applying the internal power to the first node in response to the sense amplifier strobe signal during a second bit line setup operation after a first bit line setup operation has been completed.

11. The semiconductor memory device according to claim 10, wherein the first bit line setup operation and the second bit line setup operation are sequentially performed.

12. The semiconductor memory device according to claim 10, wherein each of the page buffers further comprises a main latch suitable for temporarily storing the program data inputted from an outside during the program operation, and applying the first program enable voltage or the program inhibit voltage to the corresponding bit line during the first bit line setup operation in accordance with the temporarily stored program data.

13. The semiconductor memory device according to claim 10, wherein the page buffer sensing circuit applies the second program enable voltage higher than the first program enable voltage to the corresponding bit line during the second bit line setup operation.

14. The semiconductor memory device according to claim 10, wherein the page buffer sensing signal of the second potential level has a potential level higher than the second program permit voltage by a set threshold voltage.

15. The semiconductor memory device according to claim 10, wherein the current control circuit comprises:
   a clamp circuit coupled between the internal power and the current sensing node, and suitable for transferring the internal power to the current sensing node in response to a current sensing signal and the level of the first node; and
   a current determination circuit coupled between the internal power and the first node, and suitable for transferring the internal power to the first node in response to the sense amplifier strobe signal.

* * * * *